United States Patent
Chung et al.

(10) Patent No.: US 8,361,846 B2
(45) Date of Patent: Jan. 29, 2013

(54) ARRAY SUBSTRATE FOR DISPLAY DEVICE AND METHOD OF FABRICATING THE SAME

(75) Inventors: Jae-Moon Chung, Goyang-si (KR); Moon-Ho Choi, Daegu (KR)

(73) Assignee: LG Display Co., Ltd., Seoul (KR)

( * ) Notice: Subject to any disclaimer, the term of this patent is extended or adjusted under 35 U.S.C. 154(b) by 52 days.

(21) Appl. No.: 12/957,029

(22) Filed: Nov. 30, 2010

(65) Prior Publication Data

US 2012/0007081 A1  Jan. 12, 2012

(30) Foreign Application Priority Data

Jul. 9, 2010 (KR) .................. 10-2010-0066077

(51) Int. Cl.
- *H01L 21/00* (2006.01)
- *H01L 21/84* (2006.01)
- *H01L 21/336* (2006.01)
- *H01L 21/8234* (2006.01)
- *H01L 21/331* (2006.01)

(52) U.S. Cl. .......... 438/149; 438/48; 438/151; 438/311; 438/197

(58) Field of Classification Search .................... 438/34, 438/48, 128, 149, 151, 157, 283, 158, 133, 438/459, 704, 311, 479, 153, 517, 197

See application file for complete search history.

(56) References Cited

U.S. PATENT DOCUMENTS

| | | | |
|---|---|---|---|
| 2007/0187689 A1* | 8/2007 | Oh et al. | 257/72 |
| 2009/0243470 A1* | 10/2009 | Chu et al. | 313/504 |
| 2011/0127532 A1* | 6/2011 | Ahn et al. | 257/59 |

* cited by examiner

*Primary Examiner* — Chuong A. Luu

(74) *Attorney, Agent, or Firm* — Birch, Stewart, Kolasch & Birch, LLP

(57) ABSTRACT

An array substrate for a display device includes a substrate; gate and data lines crossing each other on the substrate to define a pixel region; a thin film transistor connected to the gate and data lines and including a gate electrode, a gate insulating layer on the gate electrode, an active layer on the gate insulating layer, an ohmic contact layer on the active layer, and source and drain electrodes on the ohmic contact layer; and a pixel electrode connected to the drain electrode, wherein the source and drain electrodes are separated from each other to define a separate region, wherein the separate region includes first to third regions in different directions, and wherein the active layer is removed in at least one of the first to third regions.

10 Claims, 15 Drawing Sheets

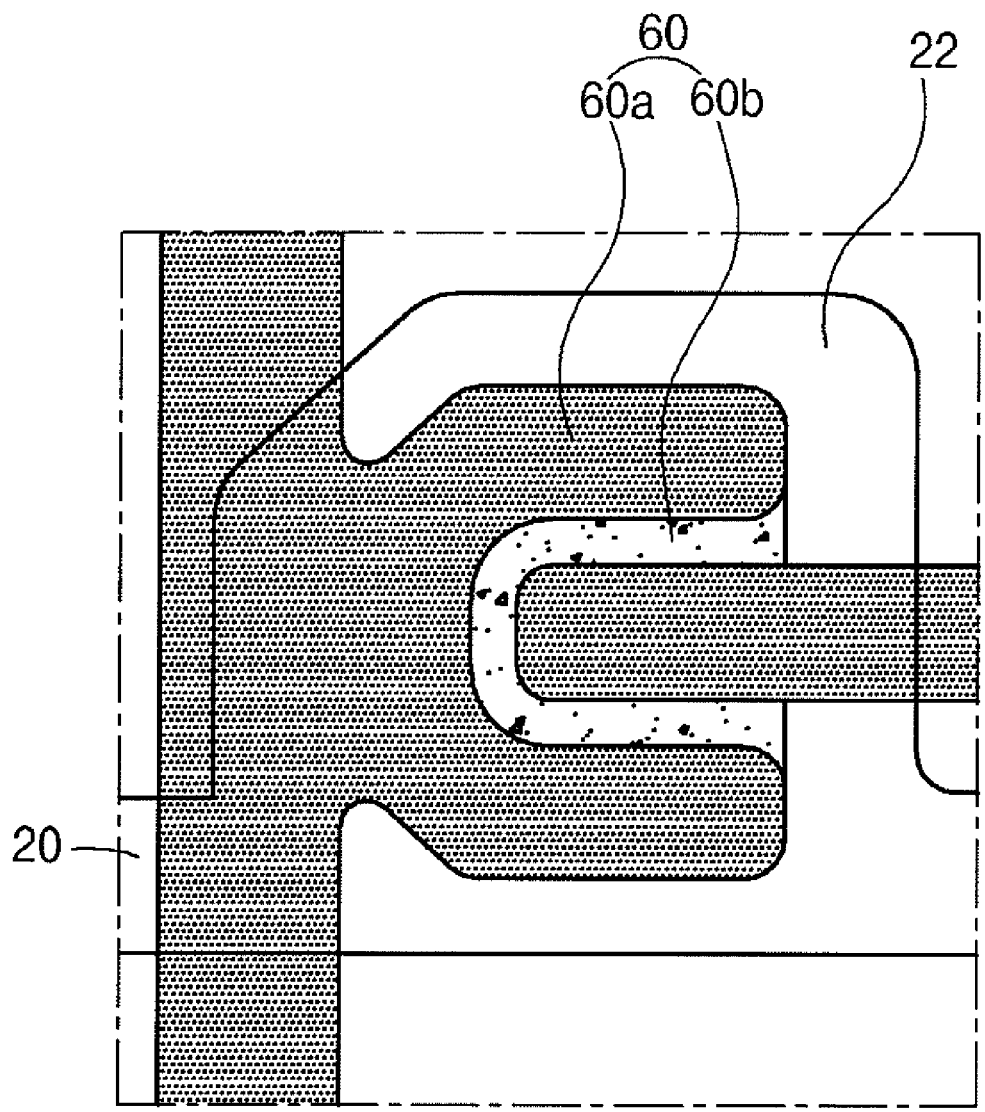

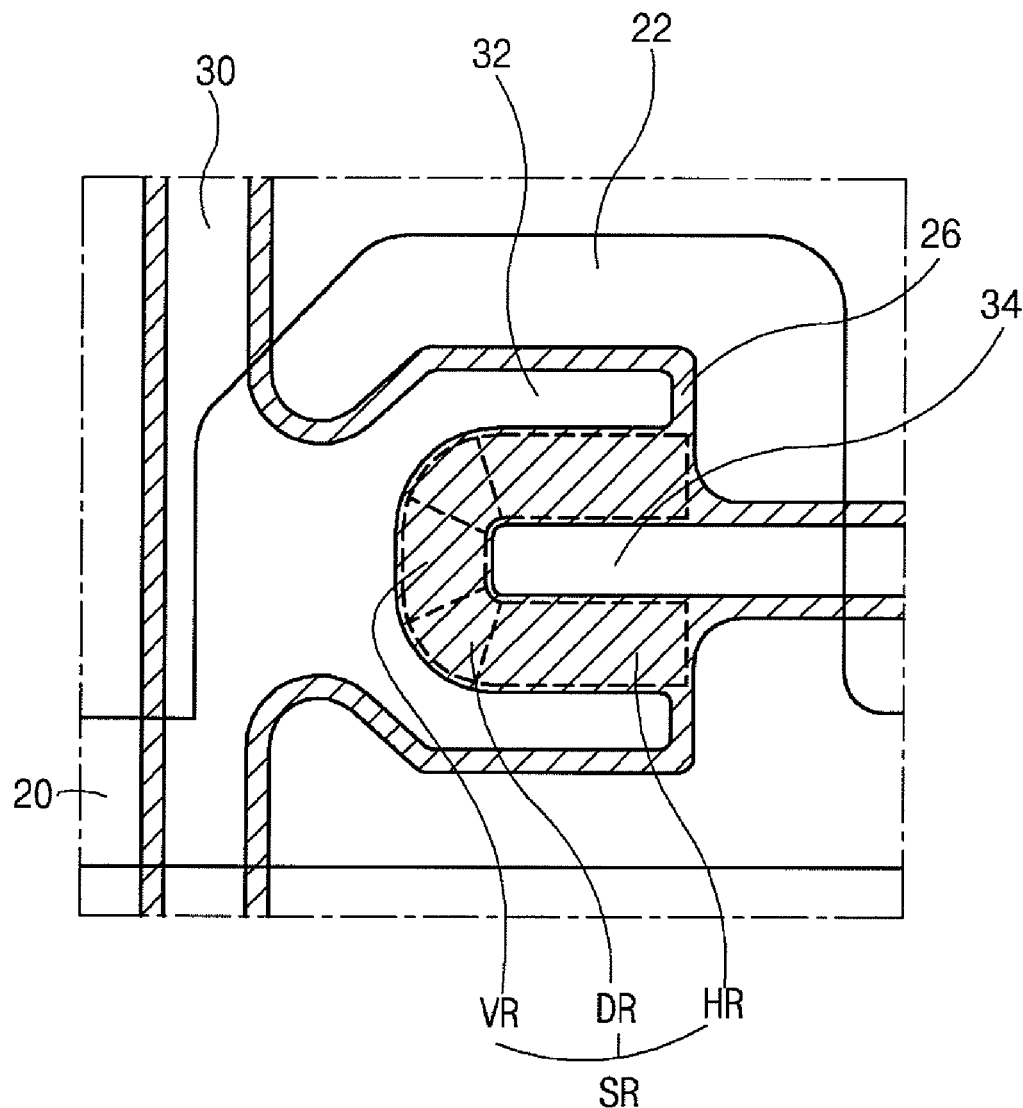

ARRAY SUBSTRATE FOR DISPLAY DEVICE AND METHOD OF FABRICATING THE SAME

The present invention claims the priority benefit of Korean Patent Application No. 10-2010-0066077, filed in Korea on Jul. 9, 2010, which is hereby incorporated by reference for all purposes as if fully set forth herein.

BACKGROUND OF THE INVENTION

1. Field of the Invention

The present invention relates to an array substrate for a display device, and more particularly, to an array substrate for a display device and a method of fabricating the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, active matrix type display devices are widely used.

In the active matrix type display device, pixel regions defined by gate and data lines crossing each other are located in a matrix type, a switching element, for example, a thin film transistor, and a pixel electrode are formed in each pixel region, and a data signal applied to the pixel region is controlled by the switching element.

The active matrix type display device includes an array substrate where the gate and data lines, the switching element and pixel electrode are formed.

FIG. 1 is a plan view illustrating an array substrate for a display device according to the related art.

Referring to FIG. 1, gate and data lines 20 and 30 crosses each other on a substrate 10 to define a pixel region P, and a thin film transistor T is connected to the gate and data lines 20 and 30.

The thin film transistor T includes a gate electrode 22, an active layer 26, and source and drain electrodes 32 and 34. The gate electrode 22 is connected to the gate line 20, the source electrode 32 is connected to the data line 30, and the drain electrode 34 is separated from the source electrode 32.

A pixel electrode 40 is formed in the pixel region P and connected to the drain electrode 34 through the drain contact hole 38.

A separate region SR between the source and drain electrodes 32 and 34 has a U shape. The active layer 26 is exposed through the separate region SR, and a part of the active layer 26 exposed through the separate region SR functions as a channel of the thin film transistor T.

FIGS. 2 and 3 are cross-sectional views taken along lines II-II and respectively, of FIG. 1.

Referring to FIGS. 2 and 3, the gate line 20 and the gate electrode 22 connected to the gate line 20 are formed on the substrate 10. A gate insulating layer 24 is formed on the gate line 20 and the gate electrode 22.

The active layer 26 made of intrinsic silicon is formed on the gate insulating layer 24 corresponding to the gate electrode 22, and an ohmic contact layer 28 made of impurity-doped silicon is formed on the active layer 26.

The data line 30 and the source and drain electrodes 32 and 34 are formed on the ohmic contact layer 28. A passivation layer 36 is formed on the data line 30, and the source and drain electrodes 32 and 34. The pixel electrode 40 is formed on the passivation layer 36.

The passivation layer 36 includes the drain contact hole 38 exposing the drain electrode 34, and the pixel electrode 40 is connected to the drain electrode 34 through the drain contact hole 38.

To reduce the number of production processes and production costs, the active layer 26, the ohmic contact layer 28, the source and drain electrodes 32 and 34, and the data line 30 are formed in a photolithographic process using one photo mask, which is explained further with reference to following drawings.

FIG. 4A is a view illustrating a photo mask used to form the active layer, and the source and drain electrodes of the array substrate for the related art display device, FIG. 4B is a view illustrating a photoresist pattern used to form the active layer, and the source and drain electrodes of the array substrate for the related art display device, and FIG. 4C is a view illustrating the active layer, and the source and drain electrodes of the array substrate for the related art display device.

To form the active layer 26, the ohmic contact layer 28, the source and drain electrodes 32 and 34, and the data line 30, an intrinsic silicon layer (not shown), an impurity-doped silicon layer (not shown), a metal layer (not shown) are sequentially formed on the gate insulating layer 24, then a photoresist layer (not shown) is formed on the metal layer, then a photo mask M is located over the photoresist layer to expose the photoresist layer to the light, and then the light-exposed photoresist layer is developed.

Referring to FIG. 4A, the photo mask M includes a blocking portion BA having the lowest transmittance, a semi-transmissive portion HTA having a transmittance higher than that of the blocking portion BA, and a transmissive portion TA having the highest transmittance. The blocking portion BA corresponds to the data line 30 and the source and drain electrodes 32 and 34, the semi-transmissive portion HTA corresponds to the separate region SR between the source and drain electrodes 32 and 34, and the transmissive portion TA corresponds to a region except for the data line 30, the source and drain electrodes 32 and 34 and the separate region SR.

Referring to FIG. 4B, through developing the light-exposed photoresist layer, a photoresist pattern 60 is formed.

The photoresist pattern 60 includes a first photoresist pattern 60a corresponding to the blocking portion BA, and a second photoresist pattern 60b corresponding to the semi-transmissive portion HTA. Since the transmittance of the blocking portion BA is less than that of the semi-transmissive portion HTA, a thickness of the first photoresist pattern 60a is more than that of the second photoresist pattern 60b.

Then, the metal layer, the impurity-doped silicon layer, and the intrinsic silicon layer are sequentially etched using the first and second photoresist patterns 60a and 60b as an etching mask to form the data line 30 and a source-drain pattern (not shown).

The source-drain pattern is a pattern corresponding to the source and drain electrodes 32 and 34 and the separate region SR.

Through the etching process, an impurity-doped silicon pattern and an active layer 26 are formed below the data line 30 and the source-drain pattern.

Then, through an ashing process, the first photoresist pattern 60a is partially removed, and the second photoresist pattern 60b is completely removed. Accordingly, the source-drain pattern corresponding to the separate region SR is exposed.

Then, the source-drain pattern and the impurity-doped silicon pattern are etched using the remaining first photoresist pattern 60a as an etching mask.

Accordingly, referring to FIG. 4C, the data line 30, the source and drain electrodes 32 and 34, the ohmic contact layer 28 below the source and drain electrodes 32 and 34, the active layer 26 which is below the ohmic contact layer 28 and exposed between the source and drain electrodes 32 and 34 are formed.

The ohmic contact layer 28 and the active layer 26 are extended below the data line 30.

The reason why the separate region SR has the U shape is to improve operation capability of the thin film transistor T within a limited area. In other words, since the active layer 26 exposed through the separate region SR functions as a channel, and the current of the thin film transistor T is proportional to the width of the channel and inversely proportional to the length of the channel, so the current of the thin film transistor T can be maximized by maximizing the width of the channel and minimizing the length of the channel in a U-shpaed region.

However, referring to FIG. 4C, the U-shaped separate region SR includes a horizontal region HR, a diagonal region DR and a vertical region VR. Referring to FIG. 4A, the semi-transmissive portion HTA corresponding to the separate region SR includes a horizontal portion HA, a diagonal portion DA, and a vertical portion VA.

In an exposure process through the semi-transmissive portion HTA, light having an energy less than an energy (Eth) that is sufficiently high to initiate chemical reaction of photoresist irradiates the photoresist. Accordingly, depth of focus in the exposure process through the semi-transmissive portion HTA is abnormally shallower and astigmatism is greater than those in an exposure process through the transmissive portion TA in which light having an energy (Eop) high enough for the chemical reaction of photoresist irradiates the photoresist.

The astigmatism is an aberration that occurs because a vertical component and a horizontal component of light incident on an optical system from a light source are focused on different spots. In particular, when the U-shaped separate region SR including the horizontal region HR, the diagonal region DA, and the vertical region VR is formed using the light exposure through the semi-transmissive portion HTA, because of the astigmatism, the focus depth of the horizontal portion HA, the focus depth of the diagonal portion DA, and the focus depth of the vertical portion VA are different or common in a very narrow range.

Thus, resolution power all over the semi-transmissive portion HTA is unstable, and error margin for the light exposure process is reduced.

In other words, the photoresist pattern 60b corresponding to the semi-transmissive portion HTA is not formed with desired uniform thickness at the horizontal region HR, the diagonal region DA and the vertical region VR. Accordingly, defect such as cluster channel open or channel short occurs. When removing the first and second photoresist patterns 60a and 60b and reworking in order to correct the defect, production efficiency of the array substrate is reduced.

For example, when part of the second photoresist pattern 60b is completely removed, the channel open occurs such that the metal layer, the impurity-doped silicon layer and the intrinsic silicon layer desired to be remained in a part of the separate region SA are removed in the etching process before the ashing process. When part of the second photoresist pattern 60b is formed with a thickness greater than desired thickness, the channel short occurs such that, because part of the second photoresist pattern 60b remains after the etching process, the metal layer, the impurity-doped silicon layer and the intrinsic silicon layer desired to be removed in a part of the separate region SA remains after the etching process.

SUMMARY OF THE INVENTION

Accordingly, the present invention is directed to an array substrate for a display device and a method of fabricating the same which substantially obviates one or more of the problems due to limitations and disadvantages of the related art.

An advantage of the present invention is to provide an array substrate for a display device and a method of fabricating the same that can prevent channel defect and improve error margin of a light exposure process.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, an array substrate for a display device includes a substrate; gate and data lines crossing each other on the substrate to define a pixel region; a thin film transistor connected to the gate and data lines and including a gate electrode, a gate insulating layer on the gate electrode, an active layer on the gate insulating layer, an ohmic contact layer on the active layer, and source and drain electrodes on the ohmic contact layer; and a pixel electrode connected to the drain electrode, wherein the source and drain electrodes are separated from each other to define a separate region, wherein the separate region includes first to third regions in different directions, and wherein the active layer is removed in at least one of the first to third regions.

In another aspect, a method of fabricating an array substrate for a display device includes forming a gate line, and a gate electrode connected to the gate line, on a substrate; forming a gate insulating layer on the gate line and the gate electrode; forming an active layer, an ohmic contact layer, and source and drain electrodes on the gate insulating layer using a photo mask including a transmissive portion, a semi-transmissive portion and a blocking portion; forming a passivation layer on the source and drain electrodes; and forming a pixel electrode connected to the drain electrode on the passivation layer, wherein the source and drain electrodes are separated from each other to define a separate region, wherein the separate region includes first to third regions in different directions, and wherein the active layer is removed in at least one of the first to third regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 4B is a view illustrating a photoresist pattern used to form the active layer, and the source and drain electrodes of the array substrate for the related art display device;

FIG. 4C is a view illustrating the active layer, and the source and drain electrodes of the array substrate for the related art display device;

DETAILED DESCRIPTION OF THE ILLUSTRATED EMBODIMENTS

Reference will now be made in detail to the illustrated embodiments of the present invention, which are illustrated in the accompanying drawings.

Figure 1:
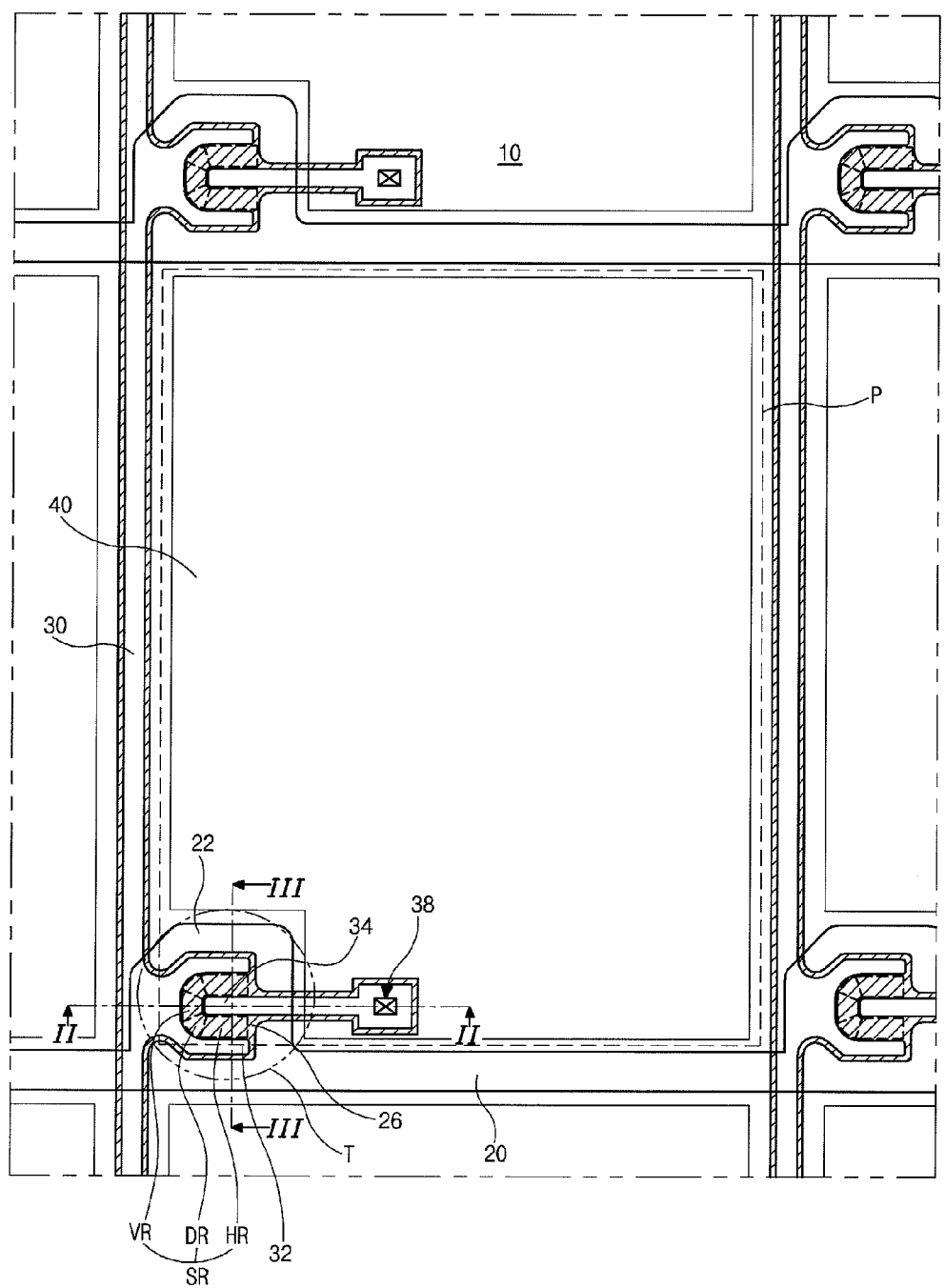
FIG. 1 is a plan view illustrating an array substrate for a display device according to the related art.
Figure 2:
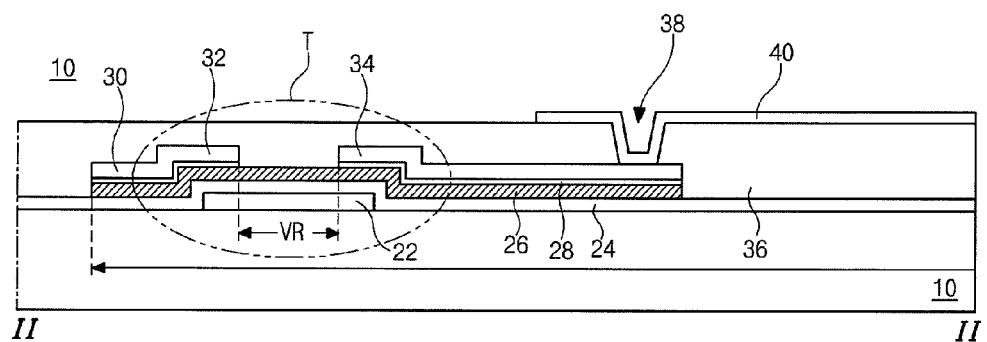
FIGS. 2 and 3 are cross-sectional views taken along lines II-II and respectively, of FIG. 1.
Figure 3:
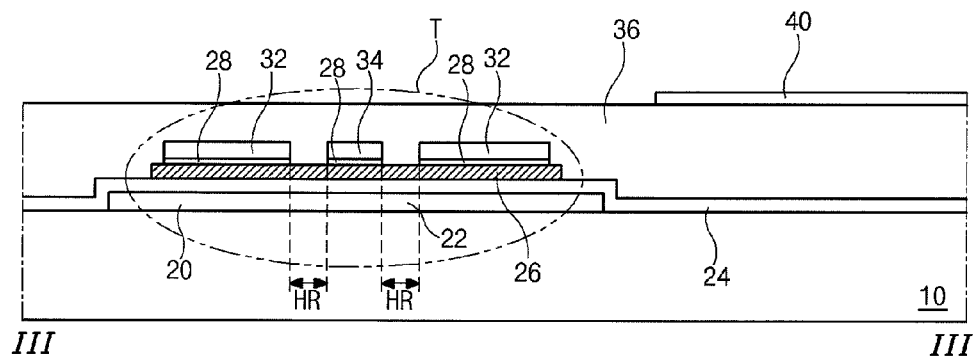
Figure 4A:
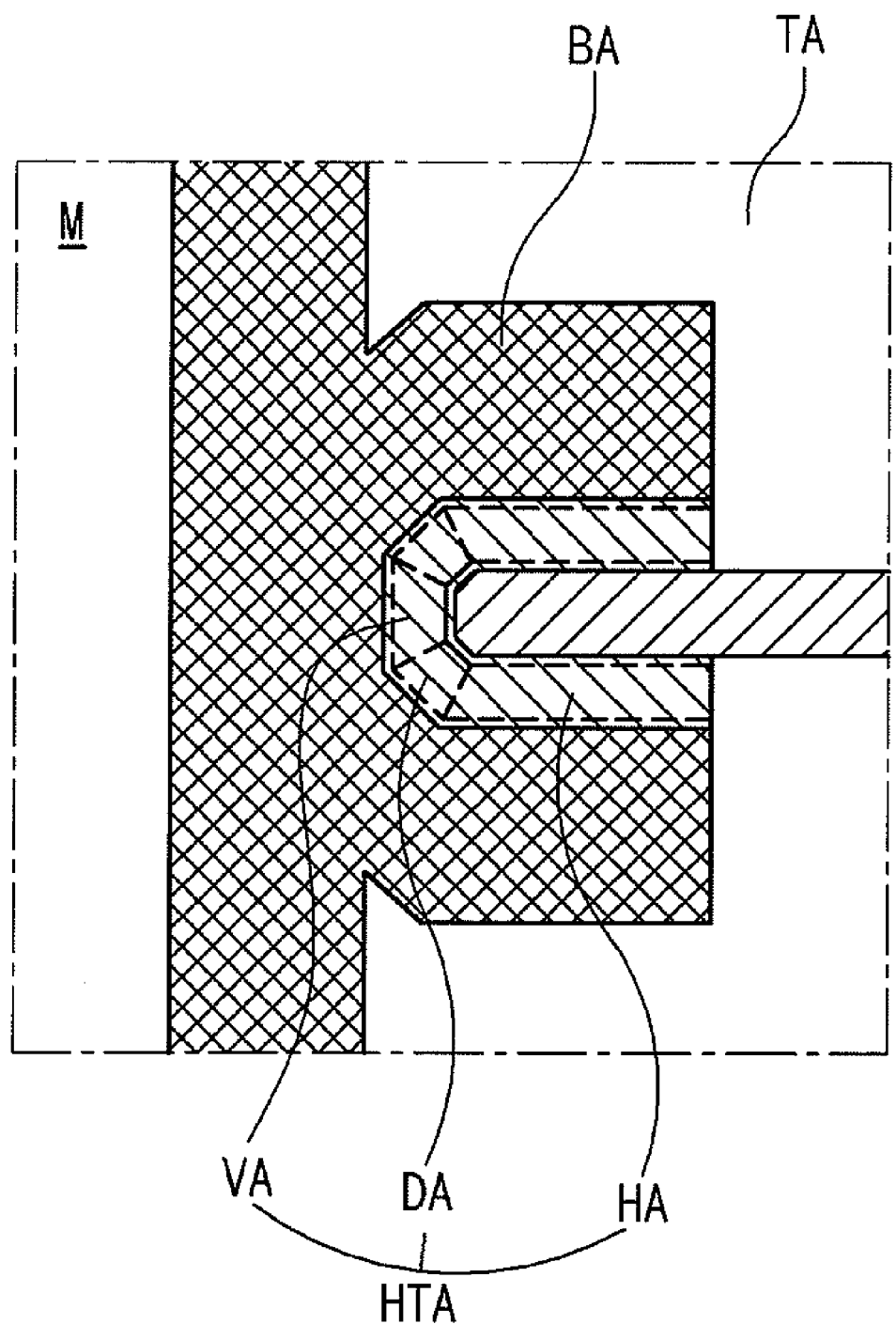
FIG. 4A is a view illustrating a photo mask used to form the active layer, and the source and drain electrodes of the array substrate for the related art display device.
Figure 5:
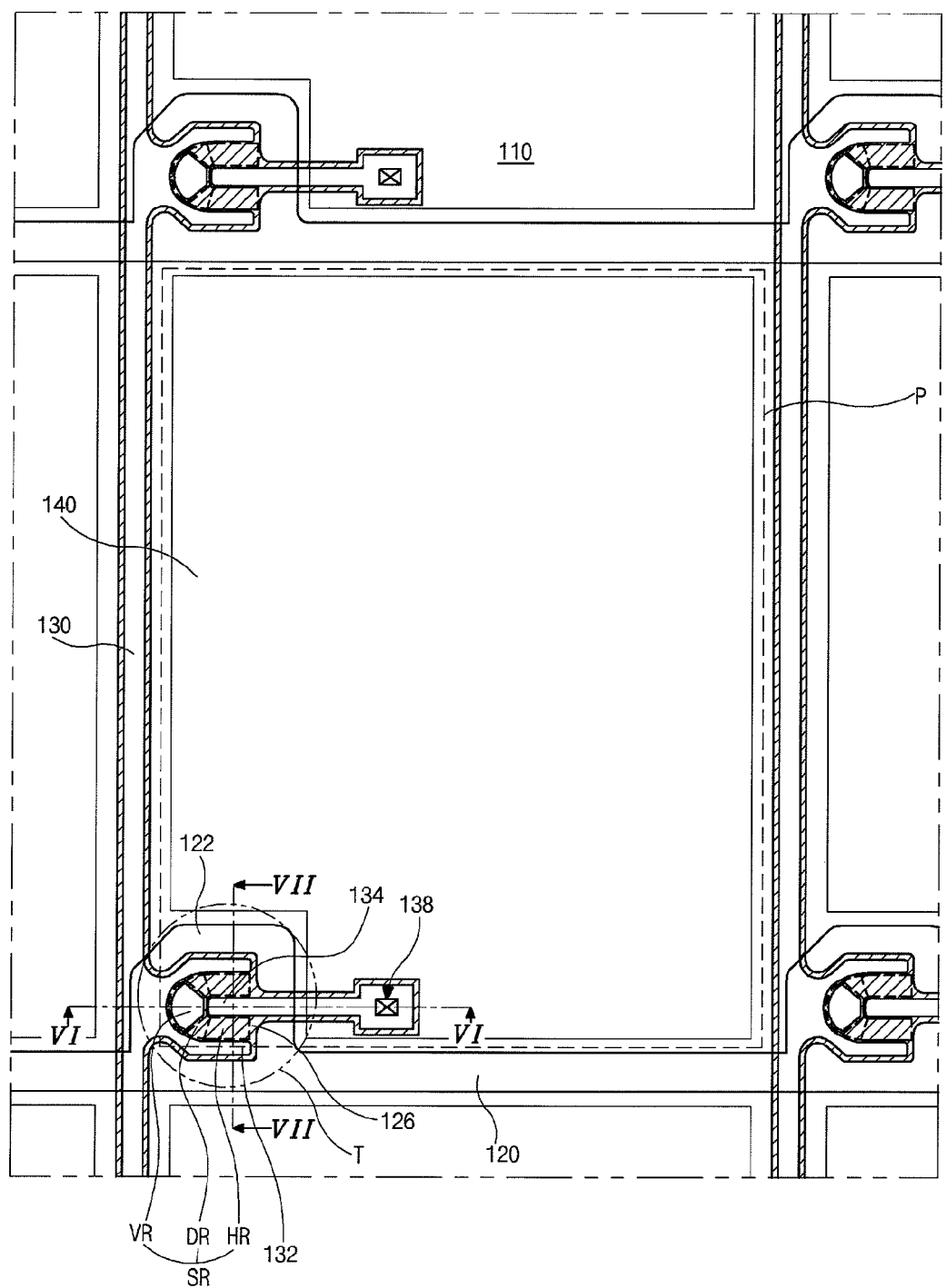
FIG. 5 is a plan view illustrating an array substrate for a display device according to an embodiment of the present invention.

FIG. 5 is a plan view illustrating an array substrate for a display device according to an embodiment of the present invention.

Referring to FIG. 5, gate and data lines 120 and 130 cross each other on a substrate 110 to define a pixel region P. A thin film transistor T is connected to the gate and data lines 120 and 130.

The thin film transistor T includes a gate electrode 122, an active layer 126, and source and drain electrodes 132 and 134. The gate electrode 122 is connected to the gate line 120, the source electrode 132 is connected to the data line 130, and the drain electrode 134 is separated from the drain electrode 134.

A pixel electrode 140 is formed in the pixel region P and connected to the drain electrode 134 through a drain contact hole 138.

A separate region SR between the source and drain electrodes 132 and 134 has a U shape. The separate region SR includes a horizontal region HR in parallel with the gate line 120, a diagonal region DR crossing the gate line 120 at an angle of about 45 degrees or about −45 degrees, and a vertical region VR perpendicular to the gate line 120.

The active layer 126 is exposed through the horizontal region HR and the diagonal region DR. A gate insulating layer 124 is exposed through the vertical region VR. In other words, the active layer 126 is remained at the horizontal region HR and the diagonal region DR, and the active layer 126 is removed at the vertical region VR so that the gate insulating layer below the active layer 126 is exposed.

Accordingly, the horizontal region HR and the diagonal region DR, where the active layer 126 is formed, among the separate region SR function as a channel region of the thin film transistor T, and the vertical region VR, where the active layer 126 is removed, does not function as the channel region of the thin film transistor T.

FIGS. 6A to 6F and 7A to 7F are cross-sectional views, taken along lines VI-VI and VII-VII, respectively, of FIG. 5, illustrating a method of fabricating the array substrate for the display device according to the embodiment of the present invention.

Figure 6A:
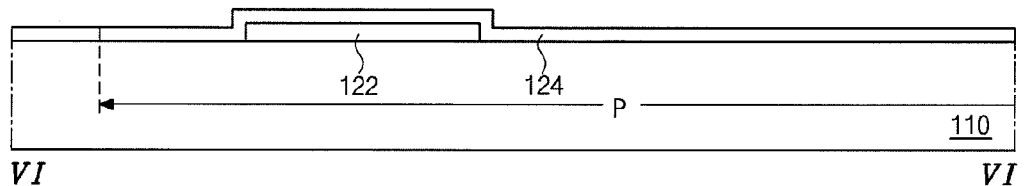
FIGS. 6A to 6F and 7A to 7F are cross-sectional views, taken along lines VI-VI and VII-VII, respectively, of FIG. 5, illustrating a method of fabricating the array substrate for the display device according to the embodiment of the present invention.
Figure 7A:
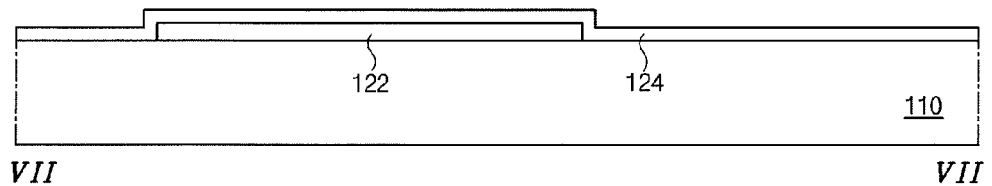

Referring to FIGS. 6A and 7A, a first metal layer is formed on a substrate 110 and patterned in a first mask process using a first photo mask (not shown) to form a gate line 120 and a gate electrode 122 connected to the gate line 120. The first metal material may be aluminum (Al), aluminum alloy, chromium (Cr), molybdenum (Mo), tungsten (W), titanium (Ti), copper (Cu), tantalum (Ta) or the like.

Then, a gate insulating layer 124 is formed on the substrate 110 having the gate electrode 122 and the gate line 120. The gate insulating layer 124 may be made of an inorganic insulating material, for example, silicon oxide ($SiO_2$) or silicon nitride (SiNx), or an organic insulating material, for example, benzocyclobutene (BCB) or acrylic resin.

Figure 6B:
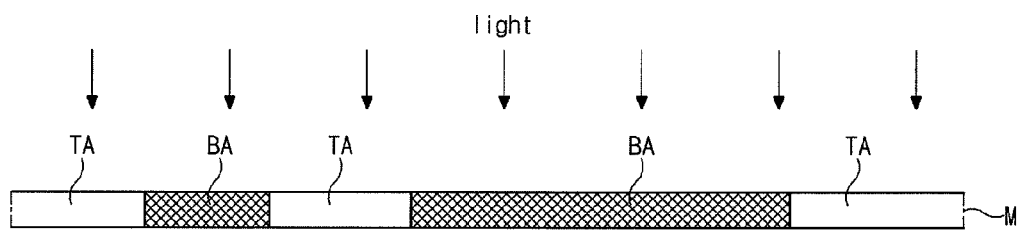
Figure 6B:
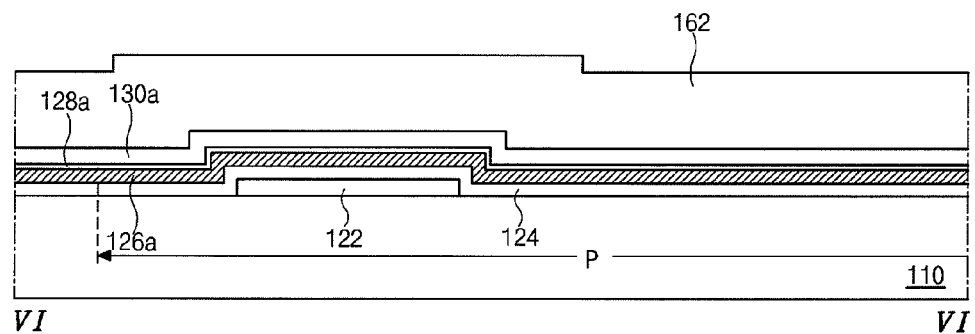
Figure 7B:
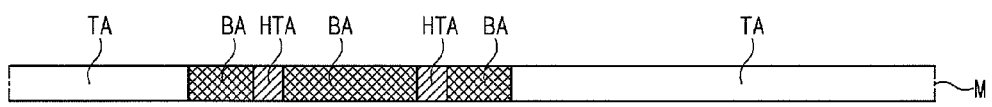
Figure 7B:
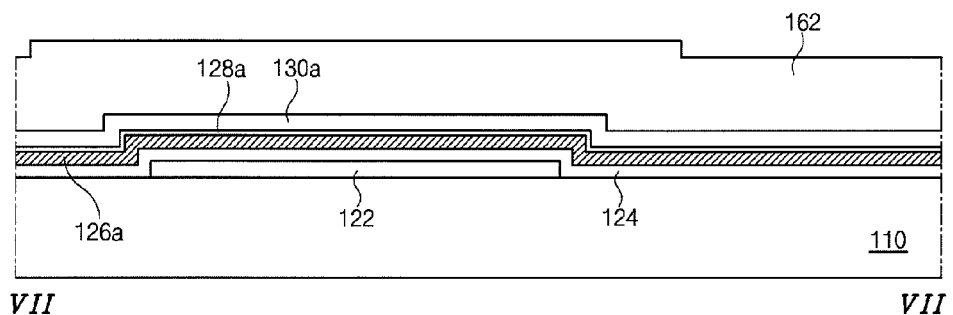

Referring to FIGS. 6B and 7B, an intrinsic silicon layer 126a, an impurity-doped silicon layer 128a, and a second metal layer 130a are sequentially formed on the gate insulating layer 124.

The intrinsic silicon layer 126a and the impurity-doped silicon layer 128a are an intrinsic amorphous silicon layer and an impurity-doped amorphous silicon layer, respectively, and may be formed using a PECVD (plasma enhanced chemical vapor deposition) or the like. The second metal material may be aluminum (Al), aluminum alloy, chromium (Cr), molybdenum (Mo), tungsten (W), titanium (Ti), copper (Cu), tantalum (Ta) or the like. The second metal layer 130a may be formed using a sputter or the like.

Then, a photoresist layer 162 is formed on the second metal layer 130a, a second photo mask M is disposed over the photoresist layer 162, and the photoresist layer 162 is exposed to light through the second photo mask M.

The second photo mask M includes a transmissive portion TA, a semi-transmissive portion HTA, and a blocking portion BA. The semi-transmissive portion HTA has a transmittance greater than that of the blocking portion BA and less than that of the transmissive portion TA.

The semi-transmissive portion HTA may include micro slits for light diffraction to obtain desired transmittance, or may include a semi-transmissive film having a transmittance of halftone, or may include both of the slits and semi-transmissive film.

The semi-transmissive portion HTA is arranged corresponding to a channel of a thin film transistor. The blocking portion BA is arranged corresponding to a data line (130 of FIG. 5), and source and drain electrodes (132 and 134 of FIG. 5) to be formed later. The transmissive portion TA is arranged corresponding to a region except for the channel, the data line 130, and the source and drain electrodes 132 and 134.

Figure 6C:
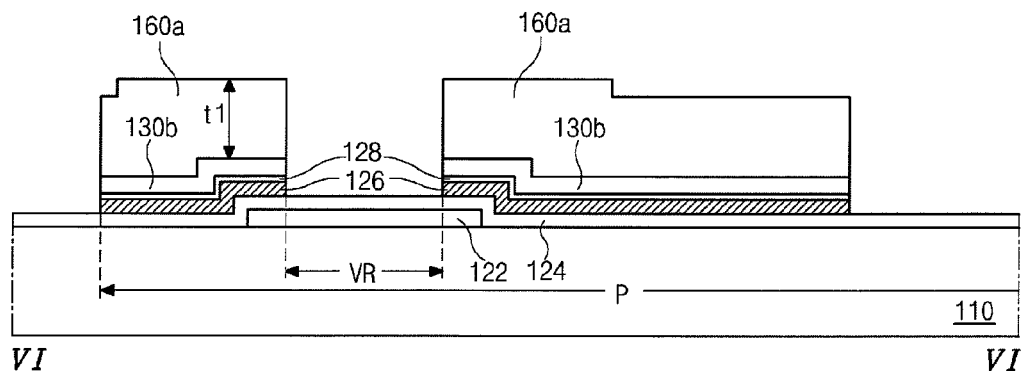
Figure 7C:
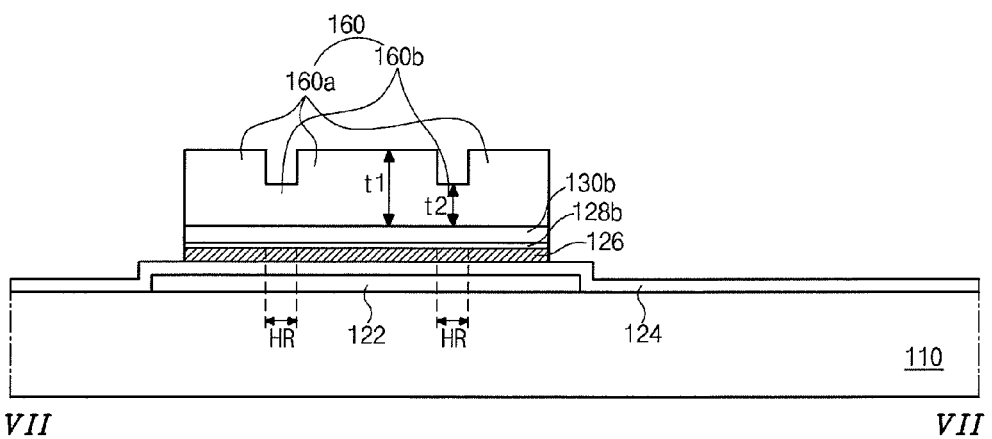

Referring to FIGS. 6C and 7C, the light-exposed photoresist layer 162 is developed to form a photoresist pattern 160 on the second metal layer 130a. The second metal layer 130a, the impurity-doped silicon layer 128a and the intrinsic silicon layer 126a are sequentially etched using the photoresist pattern 160 as an etching mask to form the data line 130, a source-drain pattern 130b, an impurity-doped silicon pattern 128b and an active layer 126.

The photoresist pattern 160 includes a first photoresist pattern 160a having a first thickness t1, and a second photoresist pattern 160b having a second thickness t2 less than the first thickness t1. The first and second photoresist patterns 160a and 160b correspond to the blocking portion BA and the semi-transmissive portion HTA, respectively.

The source-drain pattern 130b is a pattern corresponding to the source and drain electrodes 132 and 134, and a horizontal region (HR of FIG. 5) and a diagonal region (DR of FIG. 5) among a U-shaped separate region (SR of FIG. 5) between the source and drain electrodes 132 and 134. The impurity-doped silicon pattern 128b and the active layer 126 are extended below the data line 130 and the source-drain pattern 130b.

In other words, the blocking portion BA to form the first photoresist pattern 160a corresponds to the data line 130, and the source and drain electrodes 132 and 134. The semi-transmissive portion HTA to form the second photoresist pattern 160b corresponds to the horizontal region HR and the diagonal region DR among the U-shaped separate region SR between the source and drain electrodes 132 and 134. The transmissive portion TA not to form a photoresist pattern corresponds to other region including a vertical region VR of the separate region SR.

Accordingly, the second metal layer 130a of the vertical region VR is exposed between the first and second photoresist patterns 160a. The exposed second metal layer 130a, and the impurity-doped silicon layer 128a and the intrinsic silicon layer 126a below the exposed second metal layer 130a are removed, and the gate insulating layer 124 is thus exposed. The second photoresist pattern 160b is formed on the second metal layer 130a of the horizontal region HR.

Figure 6D:
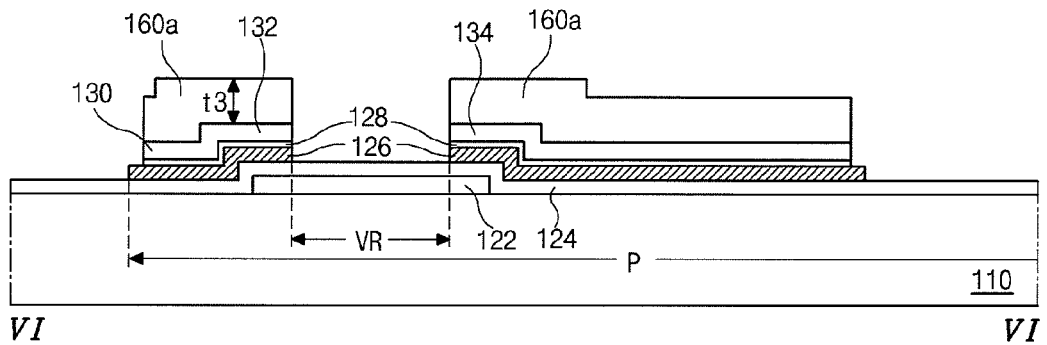
Figure 7D:
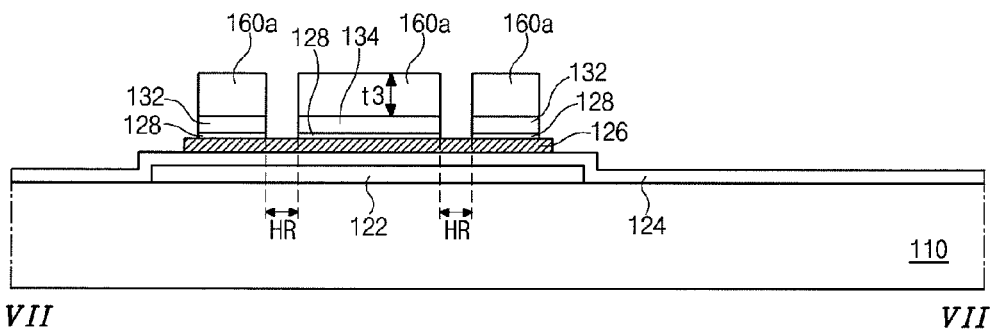

Referring to FIGS. 6D and 7D, the second photoresist pattern 160b is completely removed through an ashing process or the like. In the ashing process, the first photoresist pattern 160a is partially removed. For example, the first photoresist pattern 160a is removed by the second thickness t2 of the second photoresist pattern 160b, and the partially removed photoresist pattern 160a has a third thickness t3 (=t1−t2).

Then, the source-drain pattern 130b and the impurity-doped silicon pattern 128b are sequentially etched using the first photoresist pattern 160a having the third thickness t3 as an etching mask to form the source and drain electrodes 132 and 134 and the ohmic contact layer 128.

The gate electrode 122, the active layer 126, the source and drain electrodes 132 and 134 forms a thin film transistor T. The U-shaped separate region SR is defined between the source and drain electrodes 132 and 134. The separate region SR includes the horizontal region HR, the diagonal region DR, and the vertical region VR.

The source-drain pattern 130b and the impurity-doped silicon pattern 128b in the horizontal region HR and the diagonal region DR are removed to expose the active layer 126, and the exposed active layer 126 functions as the channel of the thin film transistor T. The active layer 126 in the vertical region VR is removed to expose the gate insulating layer 124 so that the vertical region VR is not used as the channel.

Figure 6E:
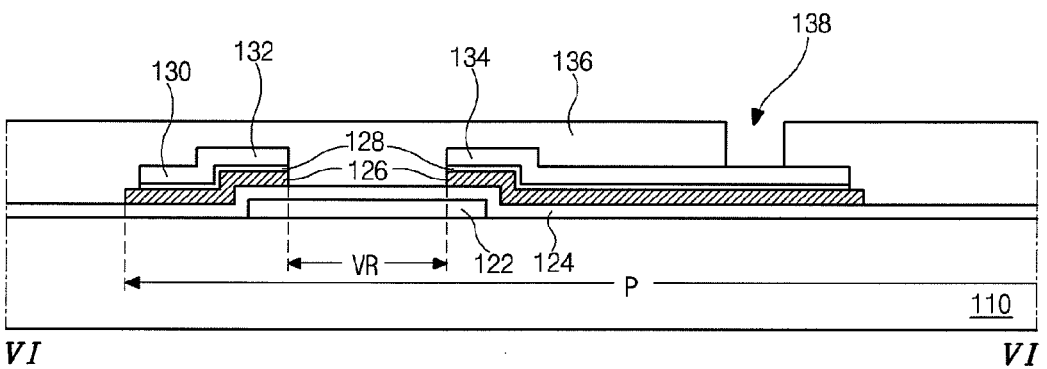
Figure 7E:
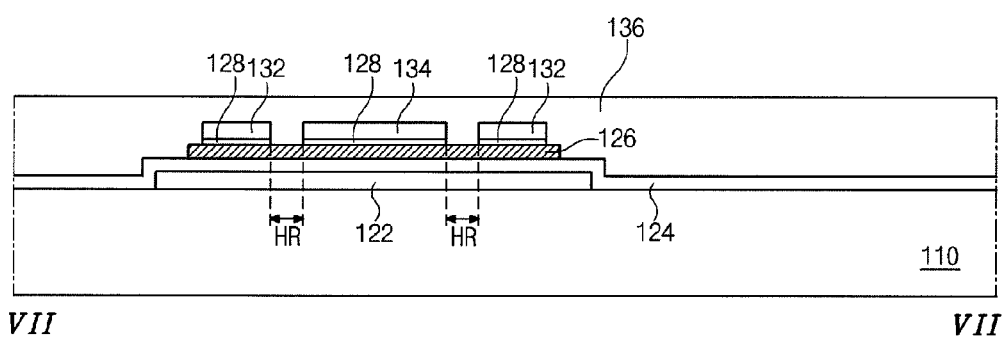

Referring to FIGS. 6E and 7E, a passivation layer 136 is formed on the substrate 110 having the data line 130 and the source and drain electrodes 132 and 134 and patterned in a third mask process using a third photo mask (not shown) to form a drain contact hole 138 exposing the drain electrode 134. The passivation layer 136 may be made of an inorganic insulating material, for example, silicon oxide ($SiO_2$) or silicon nitride (SiNx), or an organic insulating material, for example, benzocyclobutene (BCB) or acrylic resin.

Figure 6F:
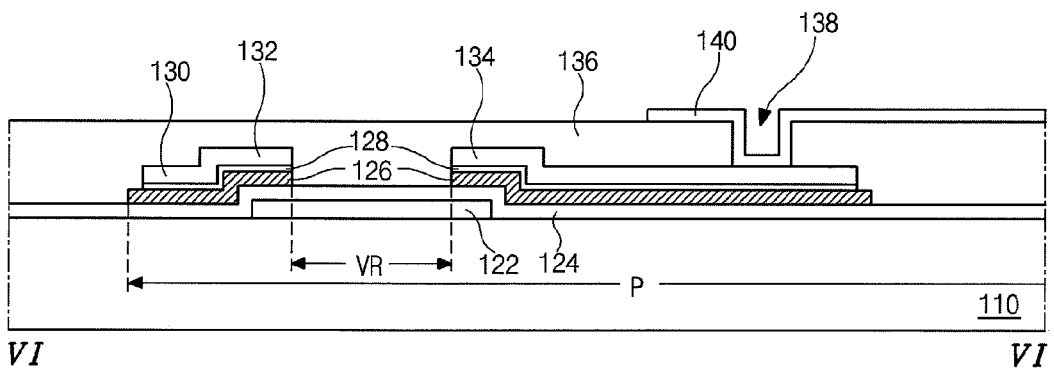
Figure 7F:
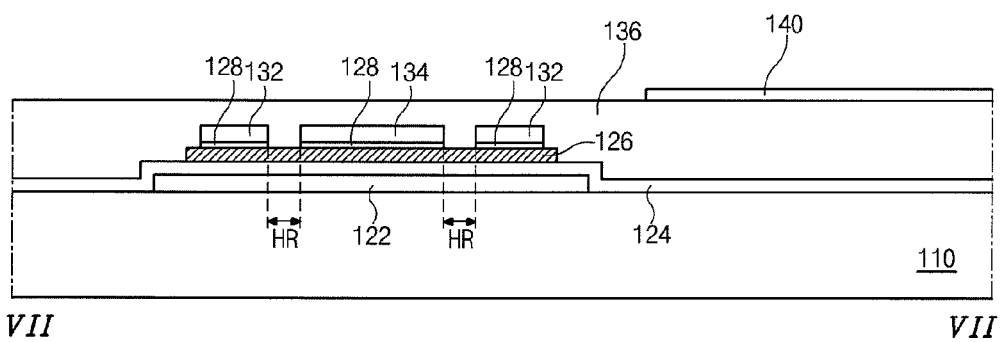

Referring to FIGS. 6F and 7F, a transparent conductive layer is formed on the passivation layer 136 and patterned in a fourth mask using a fourth photo mask to form a pixel electrode 140. The transparent conductive material may be indium-tin-oxide (ITO) or indium-zinc-oxide (IZO).

The pixel electrode 140 is connected to the drain electrode 134 through the drain contact hole 138.

As described above, the active layer 126, the ohmic contact layer 128, the source and drain electrodes 132 and 134, and the data line 130 are formed in the photolithographic process using one photo mask i.e., the second photo mask M. This process is explained in more detail further with reference to following drawings.

Figure 8A:
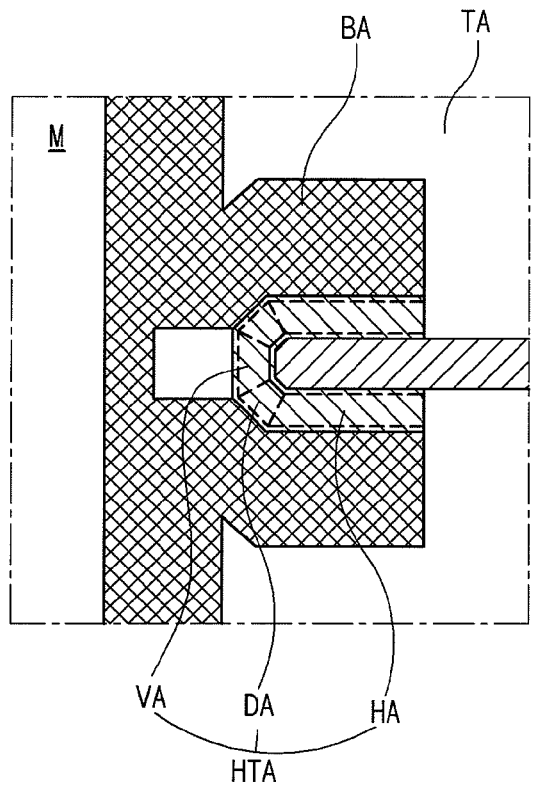
FIG. 8A is a view illustrating the second photo mask used to form the active layer, and the source and drain electrodes of the array substrate for the display device according to the embodiment of the present invention.
Figure 8B:
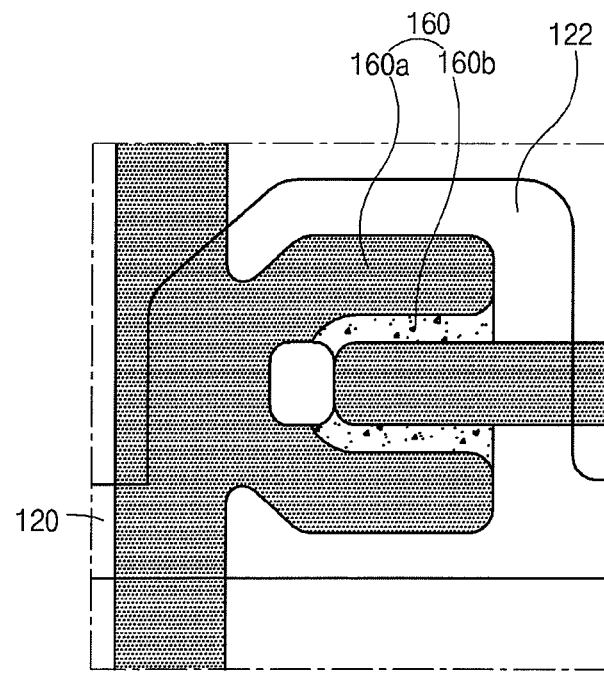
FIG. 8B is a view illustrating the photoresist pattern used to form the active layer, and the source and drain electrodes of the array substrate for the display device according to the embodiment of the present invention.
Figure 8C:
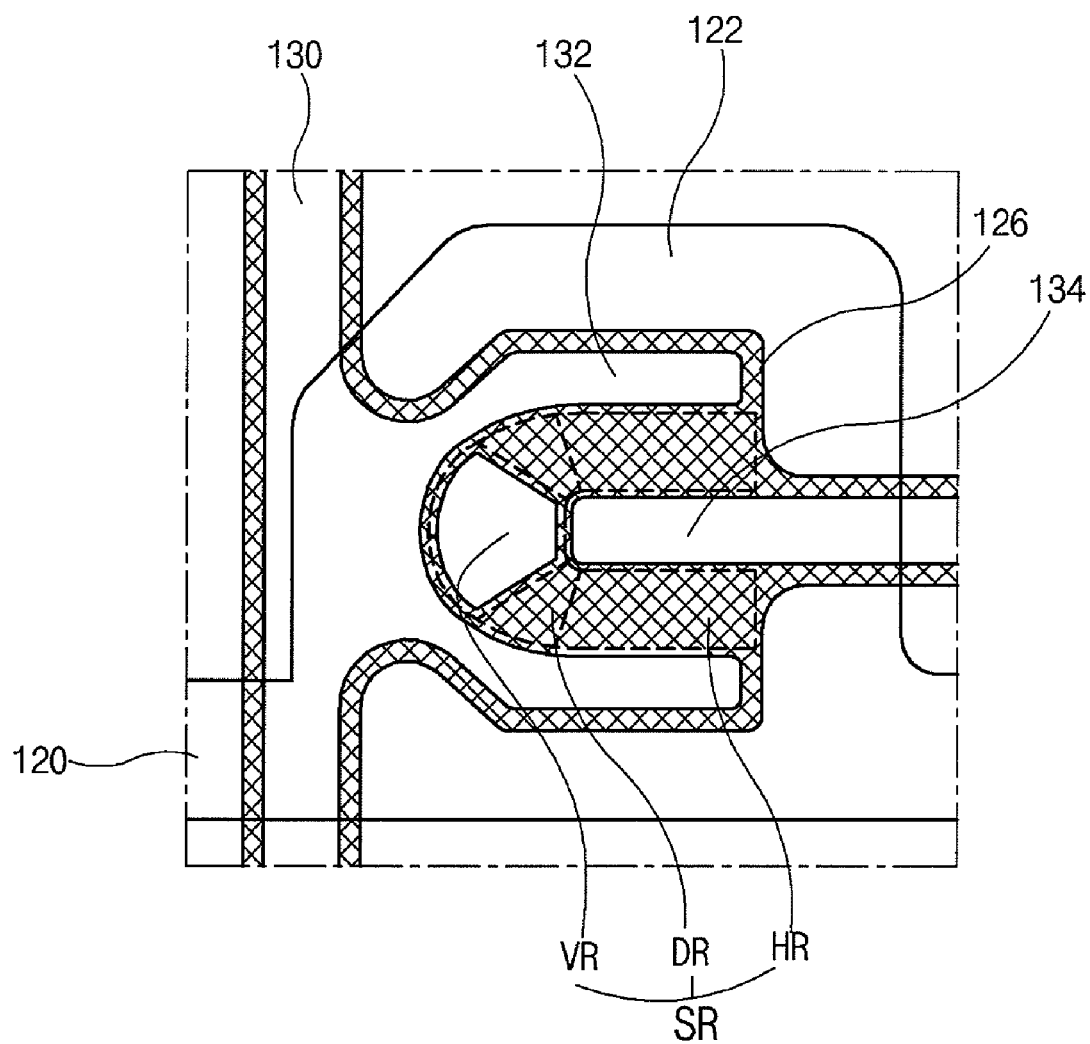
FIG. 8C is a view illustrating the active layer, and the source and drain electrodes of the array substrate for the display device according to the embodiment of the present invention.

FIG. 8A is a view illustrating the second photo mask used to form the active layer, and the source and drain electrodes of the array substrate for the display device according to the embodiment of the present invention, FIG. 8B is a view illustrating the photoresist pattern used to form the active layer, and the source and drain electrodes of the array substrate for the display device according to the embodiment of the present invention, and FIG. 8C is a view illustrating the active layer, and the source and drain electrodes of the array substrate for the display device according to the embodiment of the present invention.

Referring to FIG. 8A, to form the active layer 126, the ohmic contact layer 128, the data line 130, and the source and drain electrodes 132 and 134, the intrinsic silicon layer 126a, the impurity-doped silicon layer 128a, and the second metal layer 130a are sequentially formed on the gate insulating layer 124, then the photoresist layer 162 is formed on the second metal layer 130a, then the second photo mask M is located over the photoresist layer 162, and then the light exposure process is performed.

The second photo mask M includes the blocking portion BA having the lowest transmittance, the semi-transmissive portion HTA having a transmittance higher than that of the blocking portion BA, and the transmissive portion TA having the highest transmittance. The blocking portion BA corresponds to the data line 130, and the source and drain electrodes 132 and 134. The semi-transmissive portion HTA corresponds to the horizontal region HR and the diagonal region DR. The transmissive portion TA corresponds to a region except for the data line 130, the source and drain electrodes 132 and 134, and the horizontal and diagonal regions HR and DR.

In other words, among the separate region SR, the horizontal region HR and the diagonal region DR corresponds to the semi-transmissive portion HTA of the second photo mask M, and the vertical region VR corresponds to the transmissive portion TA of the second photo mask M.

FIG. 8 shows the second photo mask M when the semi-transmissive portion HTA includes slits, and, by extending an interval between the blocking portions BA to the extent that diffraction does not occur, the transmissive portion TA corresponding to the vertical region VR can be configured. In this case, a width of the transmissive portion TA between the blocking portions BA is greater than that of the semi-transmissive portion HTA.

When the semi-transmissive portion HTA includes a semi-transmissive film, a width of the transmissive portion TA between the blocking portions BA may be the same as that of the semi-transmissive portion HTA.

Referring to FIG. 8B, by exposing the photoresist layer 162 to light through the second photo mask M and then developing the exposed photoresist layer 162, the photoresist pattern 160 is formed on the second metal layer 130a.

The photoresist pattern 160 includes the first photoresist pattern 160a corresponding to the blocking portion BA, and the second photoresist pattern 160b corresponding to the semi-transmissive portion HTA. Since the transmittance of the blocking portion BA is less than that of the semi-transmissive portion HTA, the first thickness t1 of the first photoresist pattern 160a is greater than the second thickness t2 of the second photoresist pattern 160b.

Then, the second metal layer 130a, the impurity-doped silicon layer 128a, and the intrinsic silicon layer 126a are sequentially etched using the first and second photoresist patterns 160a and 160b as an etching mask, and thus the data line 130, the source-drain pattern 130b, the impurity-doped silicon pattern 128b, and the active layer 126 are formed.

The source-drain pattern 130b is a pattern corresponding to the source and drain electrodes 132 and 134, and the horizontal and diagonal regions HR and DR of the separate region SR. The impurity-doped silicon pattern 128b and the active layer 126 are formed below the data line 130 and the source-drain pattern 130b.

In the vertical region VR of the separate region SR, the second metal layer 130a, the impurity-doped silicon layer 128a, and the intrinsic silicon layer 126a are removed, and thus the gate insulating layer 124 is exposed.

Then, through an ashing process, the first photoresist pattern 160a is partially removed, and the second photoresist pattern 160b is completely removed. Accordingly, between the first photoresist patterns 160a, the source-drain pattern 130b corresponding to the horizontal and diagonal regions HR and DR is exposed.

Then, the source-drain pattern 130b and the impurity-doped silicon pattern 128b are etched using the first photoresist pattern 160a as an etching mask.

Accordingly, referring to FIG. 8C, the data line 130, the source and drain electrodes 132 and 134, the ohmic contact layer 128 below the source and drain electrodes 132 and 134, and the active layer 126 which is below the ohmic contact layer 128 and exposed through the horizontal and diagonal regions HR and DR are formed.

The ohmic contact layer 128 and the active layer 126 are formed below the data line 130 as well as the source and drain electrodes 132 and 134.

Accordingly, in the array substrate for the display device according to the embodiment of the present invention, by forming the separate region SR between the source and drain electrodes 132 and 134 to have the U shape, the operation capability of the thin film transistor T can be improved. Further, by patterning the layers in the horizontal and diagonal regions HR and DR among the separate region SR used as the channel region of the thin film transistor T through the semi-transmissive portion HTA of the second photo mask M, and removing the active layer 126 in the vertical region VR among the separate region SR through the transmissive portion TA of the second photo mask M, error margin of the light exposure process can be improved and channel defect due to astigmatism can be prevented.

In other words, in the light exposure process using the second photo mask M, by making the vertical region VR correspond to the transmissive portion TA instead the semi-transmissive portion HTA, the depth of focus in the horizontal and diagonal regions HR and DR excluding the vertical region VR can be controlled sufficiently. Accordingly, uniformity of thickness of the second photoresist pattern 160b corresponding to the semi-transmissive portion HTA can be improved, and error margin of the light exposure process can be improved.

In practical experiment, because of the above method, efficiency of the light exposure process is improved by about 30%, and an on-current with respect to the same channel length and width (W/L) is improved by about 20%.

In particular, recently, a display device referred to as a gate-in-panel (GIP) display device has been developed, in which a gate driving circuit supplying a gate signal to a gate line is formed in an array substrate. In this case, by forming a channel of a thin film transistor of a pixel region of a display portion and a channel of a thin film transistor of a gate driving circuit of a driving portion in the same direction, all over the array substrate, error margin of the light exposure process can be improved, and channel defect due to astigmatism of the light exposure process can be prevented.

Figure 9:
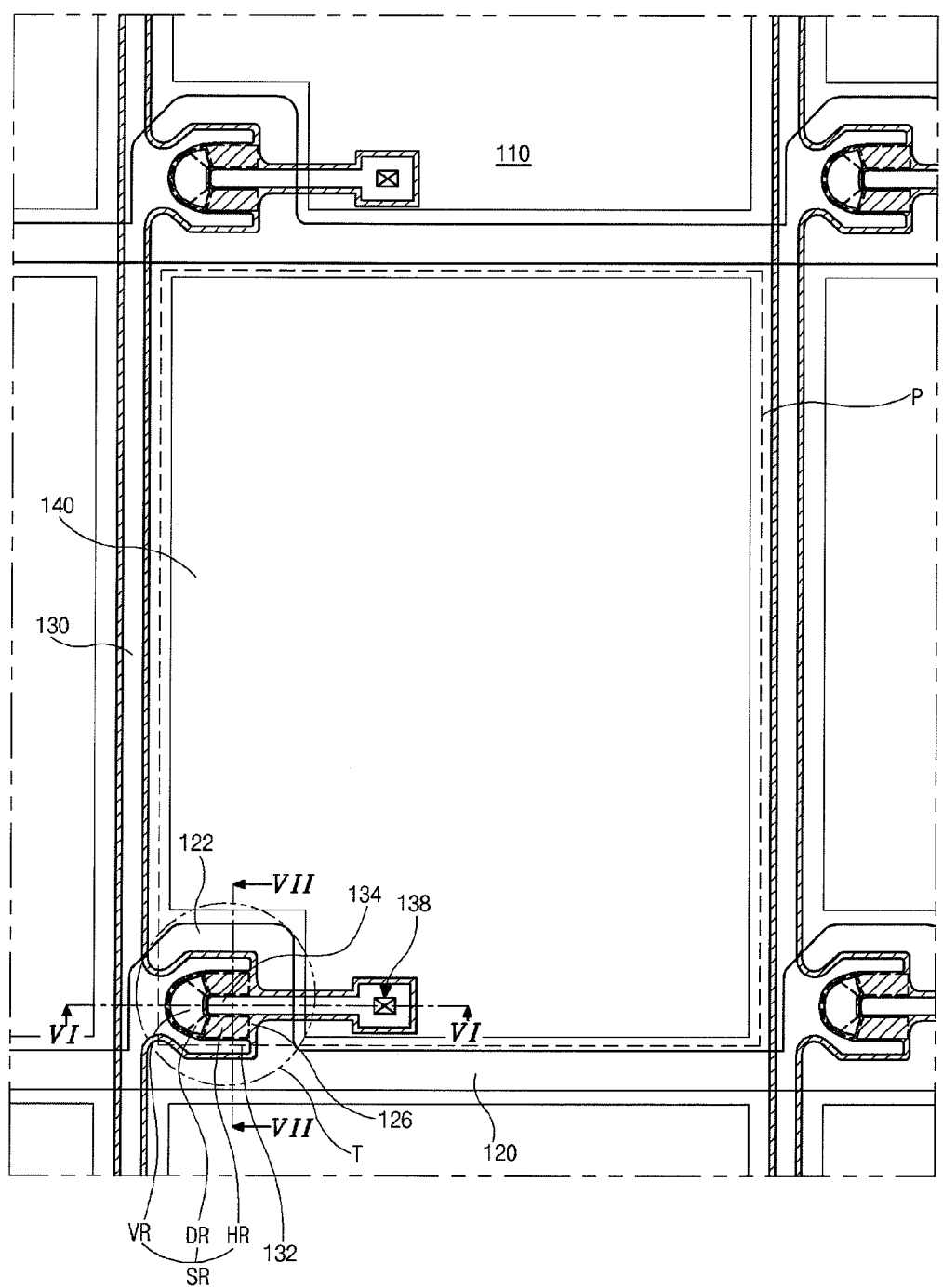
FIG. 9 is a plan view illustrating an array substrate for a display device according to another embodiment of the present invention.

FIG. 9 is a plan view illustrating an array substrate for a display device according to another embodiment of the present invention. The array substrate of FIG. 9 is similar to that of FIG. 5 except for a separate region SR between source and drain electrodes 132 and 134. Accordingly, explanations of parts similar to parts of FIGS. 5 to 8 may be omitted.

Referring to FIG. 9, the separate region SR between the source and drain electrodes 132 and 134 has a U shape. The separate region SR includes a horizontal region HR in parallel with a gate line 120, a diagonal region DR crossing the gate line 120 at an angle of about 45 degrees or about −45 degrees, and a vertical region VR perpendicular to the gate line 120.

An active layer 126 is exposed through the horizontal region HR. A gate insulating layer 124 is exposed through the vertical and diagonal regions VR and DR. In other words, the active layer 126 is remained at the horizontal region HR, and the active layer 126 is removed at the vertical and diagonal regions VR and DR and thus the gate insulating layer 124 below the active layer 126 is exposed.

Accordingly, the horizontal region HR, where the active layer 126 is formed, among the separate region SR functions as a channel region of a thin film transistor T. The vertical and diagonal regions VR and DR, where the active layer 126 is removed, among the separate region SR do not function as the channel region of the thin film transistor T.

Although not shown in the drawings, a second photo mask includes a blocking portion having the lowest transmittance, a semi-transmissive portion having a transmittance higher than that of the blocking portion, and a transmissive portion having the highest transmittance. The blocking portion corresponds to a data line 130, and the source and drain electrodes 132 and 134. The semi-transmissive portion corresponds to the horizontal region HR among the separate region SR. The transmissive portion corresponds to a region except for the data line 130, the source and drain electrodes 132 and 134, and the horizontal region HR.

In other words, the horizontal region HR among the separate region SR corresponds to the semi-transmissive portion of the second photo mask. The vertical and diagonal regions VR and DR among the separate region SR corresponds to the transmissive portion of the second photo mask.

In this case, the active layer 126 of the channel patterned through the semi-transmissive portion of the second photo mask is formed in one direction i.e., the horizontal direction. Accordingly, error margin of the light exposure process can be further improved.

Figure 10:
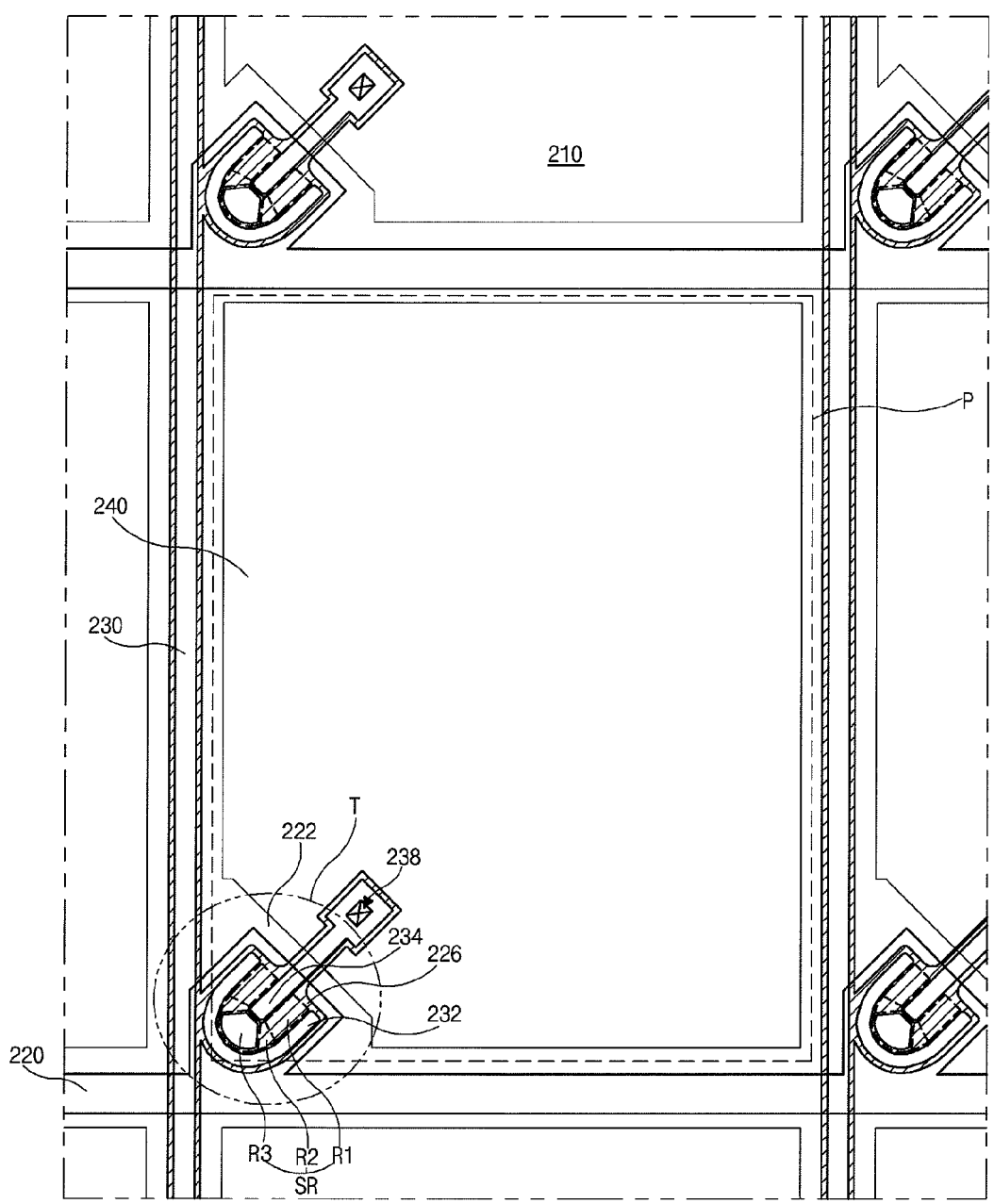
FIG. 10 is a plan view illustrating an array substrate for a display device according to yet another embodiment of the present invention.

FIG. 10 is a plan view illustrating an array substrate for a display device according to yet another embodiment of the present invention.

Referring to FIG. 10, gate and data lines 220 and 230 cross each other on a substrate 210 to define a pixel region P. A thin film transistor T is connected to the gate and data lines 220 and 230.

The thin film transistor T includes a gate electrode 222, an active layer 226, and source and drain electrodes 232 and 234. The gate electrode 222 is connected to the gate line 220, the source electrode 232 is connected to the data line 230, and the drain electrode 234 is separated from the source electrode 232.

A pixel electrode 240 is formed in the pixel region P and connected to the drain electrode 234 through a drain contact hole 238.

A separate region SR between the source and drain electrodes 232 and 234 has a U shape. The separate region SR includes a first region R1 crossing the gate line 220 at an angle of about 45 degrees, a second region R2 in parallel with or perpendicular to the gate line 220, and a third region R3 crossing the gate line 220 at an angle of about 135 degrees.

The active layer 226 is exposed through the first and second regions R1 and R2. The gate insulating layer 224 is exposed through the third region R3. In other words, the active layer 226 is remained at the first and second regions R1 and R2, and the active layer 226 is removed at the third region R3 and thus the gate insulating layer 224 below the active layer 226 is exposed.

Accordingly, the first and second regions R1 and R2, where the active layer 226 is formed, among the separate region SR function as a channel region of the thin film transistor T. The third region R3, where the active layer 226 is removed, among the separate region SR does not function as the channel region of the thin film transistor T.

Accordingly, in the array substrate for the display device according to the yet another embodiment of the present invention, by forming the separate region SR between the source and drain electrodes 232 and 234 to have the U shape, the operation capability of the thin film transistor T can be improved. Further, by patterning the layers in the first and second regions R1 and R2 among the separate region SR used as the channel region of the thin film transistor T through a semi-transmissive portion of a second photo mask, and removing the active layer 226 in the third region R3 among the separate region SR through a transmissive portion of the second photo mask, error margin of the light exposure process can be improved and channel defect due to astigmatism can be prevented.

In other words, in the light exposure process using the second photo mask, by making the third region R3 correspond to the transmissive portion instead the semi-transmissive portion, the depth of focus in the first and second regions R1 and R2 excluding the third region R3 can be controlled sufficiently. Accordingly, uniformity of thickness of a second photoresist pattern corresponding to the semi-transmissive portion can be improved, and error margin of the light exposure process can be improved.

Figure 11:
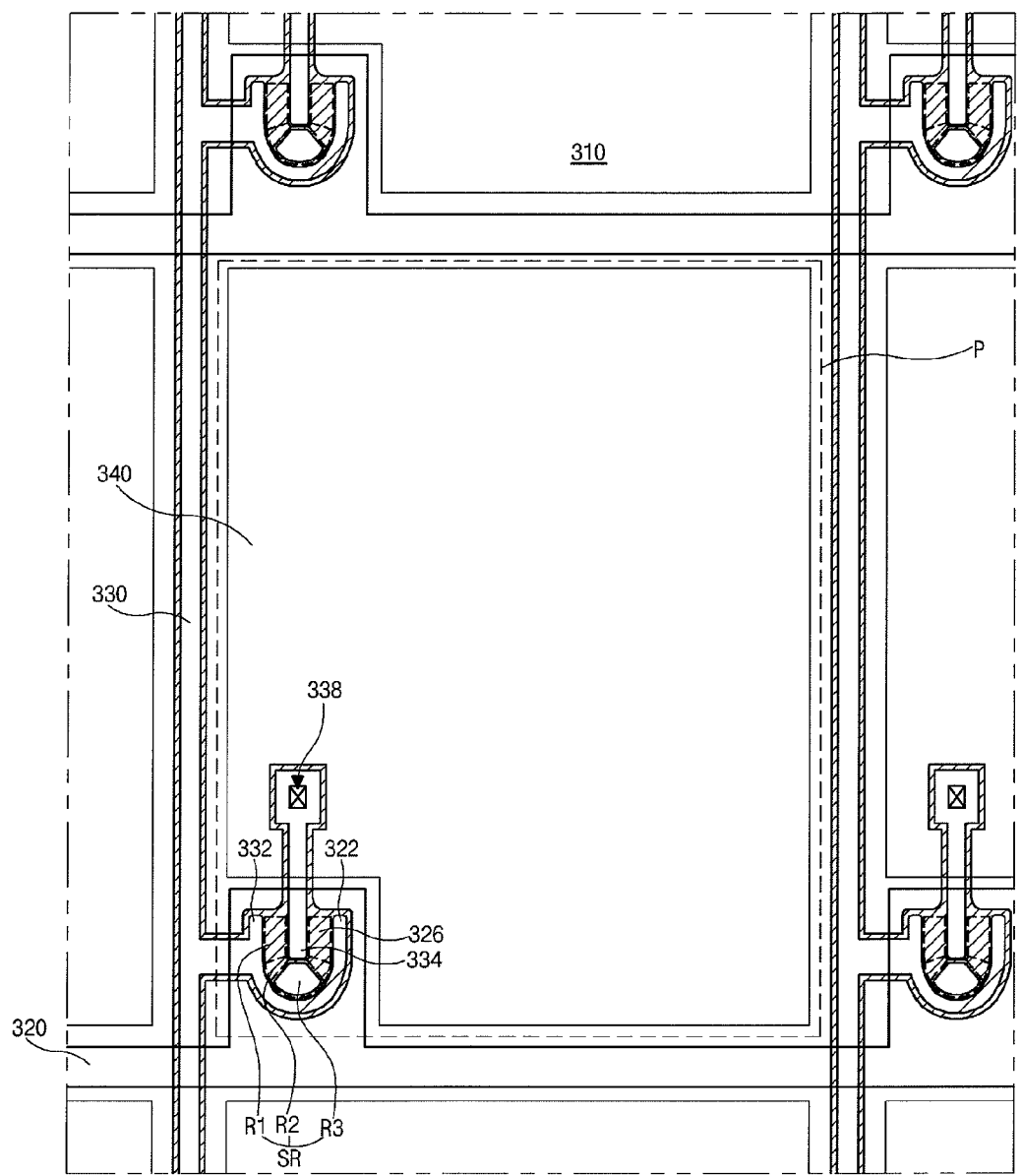
FIG. 11 is a plan view illustrating an array substrate for a display device according to yet another embodiment of the present invention.

FIG. 11 is a plan view illustrating an array substrate for a display device according to yet another embodiment of the present invention.

Referring to FIG. 11, gate and data lines 320 and 330 cross each other on a substrate 310 to define a pixel region P. A thin film transistor T is connected to the gate and data lines 320 and 330.

The thin film transistor T includes a gate electrode 322, an active layer 326, and source and drain electrodes 332 and 334. The gate electrode 322 is connected to the gate line 320, the source electrode 332 is connected to the data line 330, and the drain electrode 334 is separated from the source electrode 332.

A pixel electrode 340 is formed in the pixel region P and connected to the drain electrode 334 through a drain contact hole 338.

A separate region SR between the source and drain electrodes 332 and 334 has a U shape. The separate region SR includes a first region R1 perpendicular to the gate line 320, a second region R2 crossing the gate line 320 at an angle of about 45 degrees or about 135 degrees, and a third region R3 in parallel with the gate line 320.

The active layer 326 is exposed through the first and second regions R1 and R2. The gate insulating layer 324 is exposed through the third region R3. In other words, the active layer 326 is remained at the first and second regions R1 and R2, and the active layer 326 is removed at the third region R3 and thus the gate insulating layer 324 below the active layer 326 is exposed.

Accordingly, the first and second regions R1 and R2, where the active layer 326 is formed, among the separate region SR function as a channel region of the thin film transistor T. The third region R3, where the active layer 326 is removed, among the separate region SR does not function as the channel region of the thin film transistor T.

Accordingly, in the array substrate for the display device according to the yet another embodiment of the present invention, by forming the separate region SR between the source and drain electrodes 332 and 334 to have the U shape, the operation capability of the thin film transistor T can be improved. Further, by patterning the layers in the first and second regions R1 and R2 among the separate region SR used as the channel region of the thin film transistor T through a semi-transmissive portion of a second photo mask, and removing the active layer 326 in the third region R3 among the separate region SR through a transmissive portion of the second photo mask, error margin of the light exposure process can be improved and channel defect due to astigmatism can be prevented.

In other words, in the light exposure process using the second photo mask, by making the third region R3 correspond to the transmissive portion instead the semi-transmissive portion, the depth of focus in the first and second regions R1 and R2 excluding the third region R3 can be controlled sufficiently. Accordingly, uniformity of thickness of a second photoresist pattern corresponding to the semi-transmissive portion can be improved, and error margin of the light exposure process can be improved.

In the above explanations, although not shown in FIGS. 10 and 11, by making the third region R3 among the separate region SR correspond to the transmissive portion of the second photo mask instead of the semi-transmissive portion of the second mask, the active layer 226 and 326 is removed at the third region R3 instead of being remained at the third region R3, and thus the gate insulating layer 224 and 324 is exposed. In this case, the channel of the thin film transistor T is formed in one direction, and thus error margin of the light exposure process can be improved.

The array substrate according to the above embodiments of the present invention may be used for the display device, for example, a liquid crystal display device, an organic electroluminescent display device, or the like. When the array substrate is used for the organic electroluminescent display device, two or more thin film transistors may be formed in one pixel region, and in this case, the channels of the two or more thin film transistors may be formed in the same direction.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate for a display device, the method comprising:
    forming a gate line, and a gate electrode connected to the gate line, on a substrate;
    forming a gate insulating layer on the gate line and the gate electrode;
    forming an active layer, an ohmic contact layer, and source and drain electrodes on the gate insulating layer using a photo mask including a transmissive portion, a semi-transmissive portion and a blocking portion;
    forming a passivation layer on the source and drain electrodes; and
    forming a pixel electrode connected to the drain electrode on the passivation layer,
    wherein the source and drain electrodes are separated from each other to define a separate region, wherein the separate region is defined between opposing sides of the source and drain electrodes,
    wherein the separate region includes first to third regions in different directions, and
    wherein the active layer is removed in at least one of the first to third regions to expose the gate insulating layer.

2. The method according to claim 1, wherein the active layer remained in other regions of the first to third regions is exposed through the other regions of the first to third regions and functions as a channel of the thin film transistor.

3. The method according to claim 2, wherein the active layer removed in at least one of the first to third regions corresponds to the transmissive portion and the active layer remained in the other regions of the first to third regions corresponds to the semi-transmissive portion during the photo mask process.

4. The method according to claim 1, wherein the channel of the thin film transistor is formed in one direction.

5. The method according to claim 1, wherein the separate region has a U shape, the first region corresponds to straight portions of the U-shaped separation region, the third region corresponds to bottom portion of the U-shaped separation region, and the second region corresponds to corner portions between the straight portions and the bottom portion of the U-shaped separation region.

6. The method according to claim 5, wherein the active layer is removed in the third region of the separation region.

7. The method according to claim 5, wherein the active layer is removed in the second and third regions of the separation region.

8. The method according to claim 5, wherein the first region of the separate region parallels with the gates lines, the second region of the separation region is tilted at an angle of 45 degrees or −45 degrees with respect to the gate lines, and the third region is perpendicular to the gate line.

9. The method according to claim 5, wherein the first region of the separate region is tilted at an angle of 45 degrees with respect to the gate lines, the second region of the separation region is in parallel with or perpendicular to the gate lines, and the third region is tilted at an angle of 135 degrees with respect to the gate lines.

10. The method according to claim 5, wherein the first region of the separate region is perpendicular to the gate lines, the second region of the separation region is tilted at an angle of 45 degrees or 135 degrees with respect to the gate lines, and the third region parallels with the gates lines.

* * * * *